United States Patent
Han et al.

(10) Patent No.: US 9,640,745 B2
(45) Date of Patent: May 2, 2017

(54) LIGHT EMITTING DIODE AND METHOD OF MANUFACTURING THE SAME

(71) Applicant: Seoul Semiconductor Co., Ltd., Ansan-si (KR)

(72) Inventors: Yu Dae Han, Ansan-si (KR); Ki Bum Nam, Ansan-si (KR); Jung Doo Kim, Ansan-si (KR); Sung Soo Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/648,805

(22) PCT Filed: Dec. 2, 2013

(86) PCT No.: PCT/KR2013/011057
§ 371 (c)(1),
(2) Date: Jun. 1, 2015

(87) PCT Pub. No.: WO2014/084693
PCT Pub. Date: Jun. 5, 2014

(65) Prior Publication Data
US 2015/0340581 A1    Nov. 26, 2015

(30) Foreign Application Priority Data

Nov. 30, 2012  (KR) .................. 10-2012-0138057

(51) Int. Cl.
*H01L 33/64* (2010.01)
*H01L 33/58* (2010.01)
(Continued)

(52) U.S. Cl.
CPC ............ *H01L 33/648* (2013.01); *H01L 33/58* (2013.01); *H01L 33/62* (2013.01); *H01L 33/641* (2013.01);
(Continued)

(58) Field of Classification Search
None
See application file for complete search history.

(56) References Cited

U.S. PATENT DOCUMENTS

2002/0079837 A1* 6/2002 Okazaki .................. H01L 33/54
                                                             313/512
2004/0264192 A1* 12/2004 Nagata ...................... F21K 9/00
                                                             362/267
(Continued)

FOREIGN PATENT DOCUMENTS

JP      2001-036153      2/2001
JP      2005-079149      3/2005
(Continued)

OTHER PUBLICATIONS

International Search Report issued Mar. 21, 2014, in International Application No. PCT/KR2013/011057.
(Continued)

*Primary Examiner* — William Coleman
*Assistant Examiner* — Kien Ly
(74) *Attorney, Agent, or Firm* — H.C. & Associates, PLC (57) ABSTRACT

A light emitting diode includes: at least one light emitting chip; a substrate including lead frames electrically connected to electrodes of the at least one light emitting chip; a lens disposed on the substrate and enclosing the at least one light emitting chip; and an oil disposed in the lens and the substrate.

12 Claims, 6 Drawing Sheets

(51) Int. Cl.
*H01L 33/62* (2010.01)
*H01L 25/075* (2006.01)
*H01L 33/48* (2010.01)

(52) U.S. Cl.
CPC ........ *H01L 25/0753* (2013.01); *H01L 33/486* (2013.01); *H01L 2924/0002* (2013.01)

(56) References Cited

U.S. PATENT DOCUMENTS

| | | | | |
|---|---|---|---|---|
| 2005/0230691 A1* | 10/2005 | Amiotti | ................... | H01L 33/44 257/79 |
| 2005/0253252 A1* | 11/2005 | Owen | ..................... | F21V 29/30 257/714 |
| 2006/0012299 A1* | 1/2006 | Suehiro | .................. | H01L 33/20 313/512 |
| 2007/0216297 A1* | 9/2007 | Leng | ..................... | H01L 33/648 313/512 |
| 2008/0017870 A1* | 1/2008 | Diamantidis | ............. | F21K 9/00 257/81 |
| 2008/0087907 A1* | 4/2008 | Park | ........................ | H01L 33/56 257/98 |
| 2008/0259241 A1* | 10/2008 | Morimoto | ......... | G02F 1/133603 349/62 |
| 2009/0001372 A1* | 1/2009 | Arik | ........................ | C09K 5/10 257/58 |
| 2009/0126922 A1 | 5/2009 | Vetrovec | | |
| 2009/0140271 A1* | 6/2009 | Sah | ........................... | F21K 9/00 257/88 |
| 2010/0164346 A1* | 7/2010 | Li | ........................... | F21S 10/02 313/46 |
| 2010/0187560 A1* | 7/2010 | Traupe | ................... | B23K 20/02 257/99 |
| 2011/0058379 A1* | 3/2011 | Diamantidis | ........ | C09K 11/025 362/296.01 |
| 2012/0267659 A1* | 10/2012 | Chou | .................... | H01L 33/505 257/98 |
| 2013/0056786 A1* | 3/2013 | Hamamoto | ............. | H01L 33/56 257/99 |

FOREIGN PATENT DOCUMENTS

| | | |
|---|---|---|
| JP | 2005079149 A * | 3/2005 |
| JP | 2008-177092 | 7/2008 |
| KR | 10-2009-0073600 | 7/2009 |

OTHER PUBLICATIONS

Written Opinion issued Mar. 21, 2014, in International Application No. PCT/KR2013/011057.

* cited by examiner

LIGHT EMITTING DIODE AND METHOD OF MANUFACTURING THE SAME

CROSS-REFERENCE TO RELATED APPLICATIONS

This application is the National Stage of International Application No. PCT/KR2013/011057, filed on Dec. 2, 2013, and claims priority from and the benefit of Korean Patent Application No. 10-2012-0138057, filed on Nov. 30, 2012, which are hereby incorporated by reference for all purposes as if fully set forth herein.

BACKGROUND

Field

The present invention relates to a light emitting diode, and more particularly, a light emitting diode having an excellent heat radiation function, and a method of manufacturing the same.

Discussion of the Background

A general light emitting diode includes a light emitting chip in which an N—GaN layer, an active layer, and a P—GaN layer are sequentially formed on a substrate such as a sapphire substrate, a p-type electrode is formed on the P—GaN layer, and an n-type electrode is formed on the N—GaN layer.

In addition, a transparent electrode layer may be further formed on the P—GaN layer. The transparent electrode layer is formed in order to uniformly disperse a current in the P—GaN layer having a very large resistance component.

In the case of the general light emitting diode including the light emitting chip, the light emitting chip is mounted on a substrate including a lead frame, and a transparent mold is formed on the light emitting chip. Here, the mold includes phosphors converting light generated from the light emitting chip into light having a desired wavelength.

Recently, in the light emitting diode, a study for implementing a high efficiency light emitting diode by high current or high voltage driving has been actively conducted. Here, the high efficiency light emitting diode may mean a diode driven by a driving current of 1 A/mm$^2$ or more.

The high efficiency light emitting diode has problems such as a lifespan decrease, a brightness decrease, and the like, due to heat generated at the time of being driven at a high current or a high voltage. Particularly, a mold region bonded to the light emitting chip does not include any component for heat radiation, such that heat may not be radiated. Therefore, reliability of the light emitting diode is decreased due to the heat.

SUMMARY

An object of the present invention is to provide a light emitting diode having an excellent heat radiation structure, and a method of manufacturing the same.

Another object of the present invention is to provide a high efficiency light emitting diode capable of being driven at a high current or a high voltage by an excellent heat radiation structure.

According to an exemplary embodiment of the present invention, there is provided a light emitting diode including: at least one light emitting chip; a substrate including lead frames electrically connected to electrodes of the light emitting chip; a lens positioned on the substrate to enclose the light emitting chip; and an oil accommodated in the lens and the substrate.

The lead frame may include a first lead frame enclosing one side of the substrate and a second lead frame enclosing the other side of the substrate, the first and second lead frames may include upper and lower leads, respectively, the substrate may include accommodating holes in which the oil is accommodated, and the accommodating holes may be positioned in the upper leads.

The oil may contact outer surfaces and inner surfaces of the upper leads and contact inner surfaces of the lower leads.

The light emitting diode may further include shielding members interposed between the upper leads and the lower leads along an outer side of the lead frame in order to shield the oil, wherein the shielding members are made of a non-light-transmitting resin and have predetermined elasticity.

The light emitting diode may further include shielding members interposed between the upper leads and the lower leads along an outer side of the lead frame in order to shield the oil, wherein the shielding members are made of a light-transmitting resin and have predetermined elasticity.

The light emitting diode may further include a sub-mount substrate positioned beneath the light emitting chip, wherein the substrate includes a support part supporting the sub-mount substrate.

The support part may be a portion of the substrate and be made of an insulating material.

The support part may be made of a metal material that easily radiates heat, and the substrate may further include an insulating part bonded to the support part.

The light emitting diode may further include a heat radiation plate positioned below the substrate, wherein the heat radiation plate includes an accommodating groove in which the oil is accommodated.

The light emitting diode may further include a sub-mount substrate positioned beneath the light emitting chip, wherein the heat radiation plate includes a support part protruding on an upper surface thereof so as to support the sub-mount substrate.

The heat radiation plate may be coupled to the substrate and the lens, and include a first encapsulation resin positioned in a region in which the heat radiation plate is coupled to the substrate and the lens.

The heat radiation plate may further include a separate through-hole for adjusting a pressure at the time of accommodating the oil therein.

The light emitting diode may further include a second encapsulation resin encapsulating the through-hole, wherein the second encapsulation resin is made of a light-transmitting resin and has predetermined elasticity.

The oil may be any one of mineral oil and Amoco oil.

The light emitting diode may further include a wavelength converting layer positioned on the light emitting chip.

The lead frames may be extended up to the surroundings of the light emitting chip, and a plurality of accommodating holes may be formed on the lead frame adjacent to the light emitting chip.

The light emitting diode may further include phosphors positioned on an inner surface or an outer surface of the lens or mixed with the lens.

According to another exemplary embodiment of the present invention, there is provided a method of manufacturing a light emitting diode in which an oil is accommodated in a lens and a substrate, including: accommodating the oil by inserting the substrate on which at least one light emitting chip is mounted and the lens covering the light emitting chip into a container in which the oil is filled; and shielding the oil in the substrate using a resin having elasticity.

The accommodating of the oil may include coupling the substrate and the lens to a heat radiation plate.

The method of manufacturing a light emitting diode may further include encapsulating boundary regions between the lens, the substrate, and the heat radiation plate.

According to exemplary embodiments of the present invention, the oil is accommodated in the substrate or the heat radiation plate, damage to the light emitting diode due to heat may be minimized by a heat radiation structure radiating the heat using convection, and a heat radiation feature is excellent, such that a high efficiency light emitting diode driven at a high current or a high voltage may be implemented.

In more detail, the light emitting diode according to the present invention includes an optimized heat radiation structure in which the oil is not only accommodated in the substrate and the heat radiation plate, but also accommodated in the lens positioned on the light emitting chip to cool heat of an upper portion of the light emitting chip using convection. Therefore, the light emitting diode according to the present invention includes a mold positioned on the light emitting chip, such that it has a larger heat radiation effect by a heat radiation difference of the upper portion of the light emitting chip as compared with a general light emitting diode having a bad heat radiation feature.

DETAILED DESCRIPTION OF THE ILLUSTRATED EMBODIMENTS

Hereinafter, exemplary embodiments of the present invention will be described in detail with reference to the accompanying drawings. Exemplary embodiments to be provided below are provided by way of example so that the spirit of the present invention may be sufficiently transferred to those skilled in the art. Therefore, the present invention is not limited to exemplary embodiments to be described below, but may be implemented in other forms. In addition, in the accompanying drawings, widths, lengths, thicknesses, and the like, of components may be exaggerated for convenience. Like reference numerals denote like components throughout the present specification.

Figure 1:
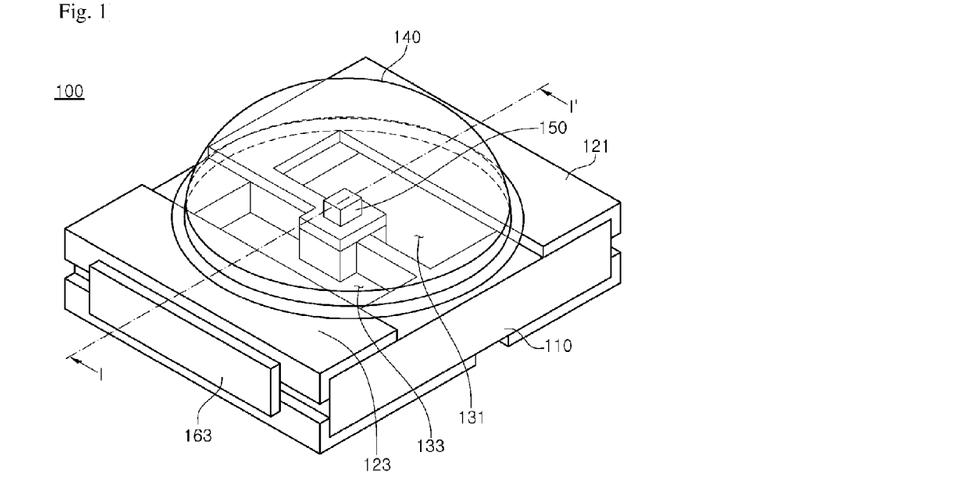
FIG. 1 is a perspective view illustrating a light emitting diode according to a first exemplary embodiment of the present invention.
Figure 2:
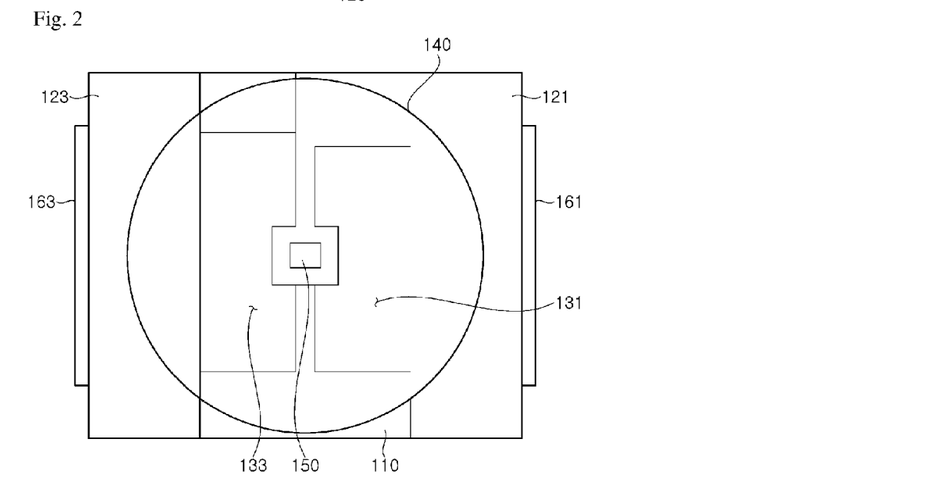
FIG. 2 is a plan view illustrating the light emitting diode of FIG. 1.
Figure 3:
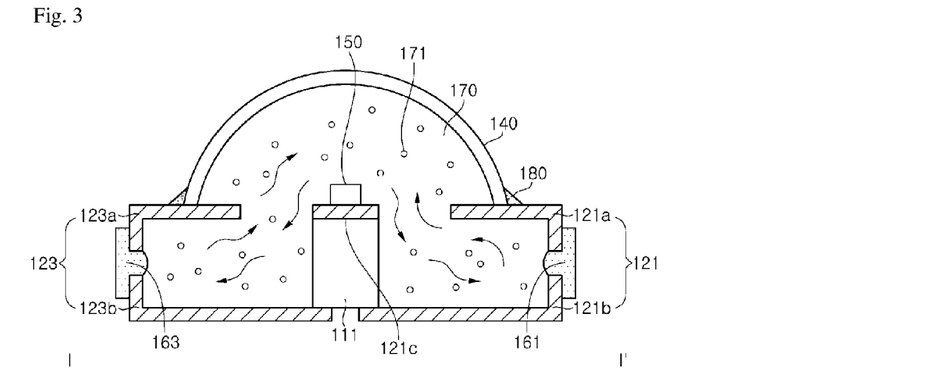
FIG. 3 is a cross-sectional view of the light emitting diode taken along line I-I' of FIG. 1.

FIG. 1 is a perspective view illustrating a light emitting diode according to a first exemplary embodiment of the present invention, FIG. 2 is a plan view illustrating the light emitting diode of FIG. 1, and FIG. 3 is a cross-sectional view of the light emitting diode taken along line I-I' of FIG. 1.

As illustrated in FIGS. 1 to 3, the light emitting diode 100 according to the first exemplary embodiment of the present invention is configured to include a substrate 110, first and second lead frames 121 and 123, a sub-mount substrate 121c, a light emitting chip 150, a lens 140, an oil 170, first and second shielding members 161 and 163, and first and second accommodating holes 131 and 133.

The sub-mount substrate 121c is formed simultaneously with the first and second lead frames 121 and 123 at the time of forming the first and second lead frames 121 and 123. That is, the sub-mount substrate 121c may be made of the same material as that of the first and second lead frames 121 and 123. As an example, the sub-mount substrate 121c may be made of a conductive material. The sub-mount substrate 121c may be connected to the first lead frame 121. Although only a structure in which the sub-mount substrate 121c and the first lead frame 121 are connected to each other has been described in the first exemplary embodiment of the present invention, the present invention is not limited thereto. That is, the sub-mount substrate 121c may be separated from the first lead frame 121. That is, the sub-mount substrate 121c may be separated from the first and second lead frames 121 and 123, and the light emitting chip 150 mounted on the sub-mount substrate 121c may be electrically connected to the first and second lead frames 121 and 123 by wires (not illustrated).

The light emitting chip 150 is mounted on the sub-mount substrate 121c and includes electrodes (not illustrated). Although not illustrated in detail in FIGS. 1 to 3, the light emitting chip 150 may be electrically connected to the first and second lead frames 121 and 123 by wires (not illustrated). However, the present invention is not limited thereto. That is, all of the wires may be omitted in the light emitting chip 150 according to the present invention and the electrodes of the light emitting chip 150 may be directly connected to the first and second lead frames 121 and 123, depending on a kind of light emitting diode 150. In addition, only any one of the electrodes of the light emitting chip 150 may be connected to any one of the first and second lead frames 121 and 123 by the wire.

The substrate 110 provides a basic frame that may determine positions of the first and second lead frames 121 and 123, and includes a support part 111 supporting the sub-mount substrate 121c. Although not illustrated in detail in FIGS. 1 to 3, the support part 111 may adhere to the sub-mount substrate 121c through an adhesive material.

The first and second lead frames 121 and 123 are positioned along an outer surface of the substrate 110, have different polarities, and are spaced apart from each other by a predetermined interval. The first and second lead frames 121 and 123 may be connected to the electrodes of the light emitting chip 150, respectively.

The first lead frame 121 includes a first upper lead 121a positioned on a portion of an upper surface of the substrate 110 and a portion of one side surface of the substrate 110, and a first lower lead 121b positioned on a portion of a lower surface of the substrate 110 and another portion of one side surface of the substrate 110.

The second lead frame 123 includes a second upper lead 123a positioned on another portion of the upper surface of the substrate 110 and a portion of the other side surface of the substrate 110, and a second lower lead 123b positioned on another portion of the lower surface of the substrate 110 and another portion of the other side surface of the substrate 110.

The first and second accommodating holes 131 and 133 may be formed at the time of manufacturing the substrate 110 and the first and second lead frames 121 and 123. The first and second accommodating holes 131 and 133 may be positioned in the substrate 110. The first accommodating hole 131 may be formed between the first upper lead 121a and the sub-mount substrate 121c, and exposes the first lower lead 121b. The second accommodating hole 133 may be formed between the second upper lead 123a and the sub-mount substrate 121c, and exposes the second lower lead 123b. Therefore, the light emitting diode 100 according to the present invention may be exposed to the outside of inner surfaces of the first and second lead frames 121 and 123 by the first and second accommodating holes 131 and 133.

The oil 170 is made of a light-transmitting material having high light transmissivity. In the present invention, the oil 170 may be one of mineral oil and Amoco oil, but is not limited thereto. That is, the oil 170 may be any oil that is transparent over the entire visible light region and has a refractive index of 1.4 to 1.5.

The oil 170 includes phosphors 171 converting light generated from the light emitting chip 150 into light having a specific wavelength band desired by a user.

The oil 170 may not only be accommodated on the light emitting chip 150, but also be accommodated in the substrate 110 through the first and second accommodating holes 131 and 133.

The oil 170 may contact upper surfaces and inner surfaces of the first and second upper leads 121a and 123a and inner surfaces of the first and second lower leads 121b and 123b through the first and second accommodating holes 131 and 133. Heat generated from the light emitting chip 150 and the first and second lead frames 121 and 123 is cooled by convection of the oil 170. The light emitting diode 100 according to the present invention has an optimized structure that may maximize cooling performance by convection by widening a contact area between the oil 170 and the first and second lead frames 121 and 123.

The first and second shielding members 161 and 163 are positioned outside the first and second lead frames 121 and 123, respectively. In more detail, the first shielding member 161 may be formed in a boundary region between the first upper lead 121a and the first lower lead 121b, and the second shielding member 163 may be formed in a boundary region between the second upper lead 123a and the second lower lead 123b.

The first and second shielding members 161 and 163 serve to prevent leakage of the oil 170 accommodated in the substrate 110.

In addition, the first and second shielding members 161 and 163 have predetermined elasticity. That is, the first and second shielding members 161 and 163 are made of a resin having elasticity to serve to buffer expansion and contraction of the oil 170 by the heat.

The first and second shielding members 161 and 163 are made of a light-transmitting resin so that light may be transmitted therethrough to serve to improve light extraction of the light emitting diode 100 in a lateral direction.

Although only the case in which the first and second shielding members 161 and 163 are made of the light-transmitting resin has been described in the first exemplary embodiment of the present invention, the present invention is not limited thereto. That is, the first and second shielding members 161 and 163 may also be made of a non-light-transmitting resin.

Therefore, in the light emitting diode 100 according to the present invention, the expansion and the contraction of the oil 170 are buffered by the first and second shielding members 161 and 163, thereby making it possible to improve reliability of a product and improve the light extraction in the lateral direction.

The lens 140 is positioned on the substrate 110, and although only the case in which the lens 140 has a hemispherical shape has been described in the present exemplary embodiment, the present invention is not limited thereto. That is, the lens 140 may have various shapes. For example, a planar lens having a flat upper surface may also be included. The lens 140 may be coupled to the substrate 110 through a separate encapsulation resin 180. However, the present invention is not limited thereto. That is, the lens 140 may also be coupled to the substrate 110 without using the separate encapsulation resin 180.

In a method of manufacturing the light emitting diode 100 according to the first exemplary embodiment of the present invention, the substrate 110 to which the lens 140 is coupled is inserted into a container in which the oil 170 is accommodated to allow the oil 170 to be accommodated in the substrate 110. When the oil 170 is accommodated in the substrate 110, the oil 170 in the substrate 110 is shielded using the first and second shielding members 161 and 163. Here, the lens 140 may also be coupled to the substrate 110 within the container.

In another method of manufacturing the light emitting diode 100 according to the first exemplary embodiment of the present invention, the light emitting diode 100 may be manufactured by coupling the lens 140 to the substrate 110 and injecting the oil 170 through shielding holes in which the first and second shielding members 161 and 163 are installed before the first and second shielding members 161 and 163 are installed.

As described above, in the light emitting diode 100 according to the first exemplary embodiment of the present invention, the oil 170 accommodated in the substrate 110 directly contacts the upper surfaces and the inner surfaces of the first and second lead frames 121 and 123, thereby making it possible to maximize the cooling performance using the convection.

In addition, in the light emitting diode 100 according to the first exemplary embodiment of the present invention, the first and second shielding members 161 and 163 having predetermined elasticity and made of the light-transmitting resin are installed in a boundary region between the first upper lead 121a and the first lower lead 121b and a boundary region between the second upper lead 123a and the second lower lead 123b, respectively, outside the substrate 110 to buffer the expansion and the contraction of the oil 170, thereby making it possible to improve the reliability of the product and improve light efficiency in the lateral direction.

Figure 4:
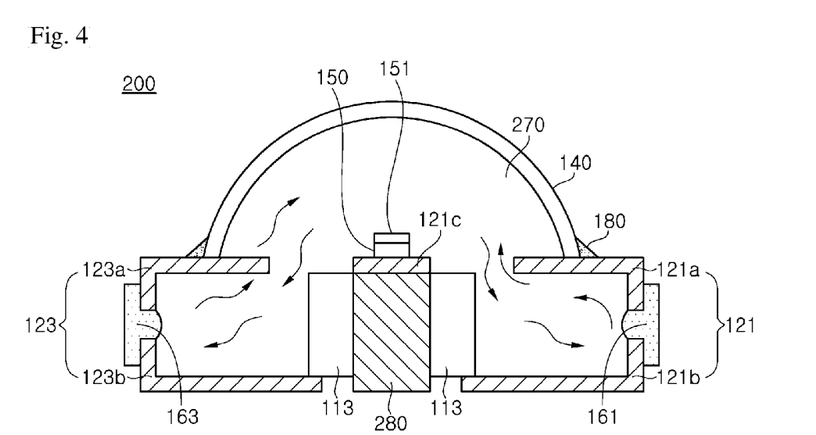
FIG. 4 is a cross-sectional view illustrating a light emitting diode according to a second exemplary embodiment of the present invention.

FIG. 4 is a cross-sectional view illustrating a light emitting diode according to a second exemplary embodiment of the present invention.

As illustrated in FIG. 4, all components of the light emitting diode 200 according to the second exemplary embodiment of the present invention except for a wavelength converting layer 151, an oil 270, an insulating part 113, and a heat sink 280 are the same as those of the light emitting diode 100 (See FIG. 1) according to the first exemplary embodiment of the present invention. Therefore, the same components will be denoted by the same reference numerals, and a detailed description therefor will be omitted.

In the light emitting diode 200 according to the second exemplary embodiment of the present invention, the wavelength converting layer 151 is formed on the light emitting chip 150.

The wavelength converting layer 151 serves to convert light from the light emitting chip 150 into light having a specific wavelength band. Therefore, in the light emitting diode 200 according to the second exemplary embodiment of the present invention, the wavelength converting layer 151 is directly formed on the light emitting chip 150, such that the oil 170 does not include phosphors.

Although only a structure in which the wavelength converting layer 151 is formed on the light emitting chip 150 in the light emitting diode 200 according to the second exemplary embodiment of the present invention has been described, the present invention is not limited thereto. That is, the wavelength converting layer 151 may also be formed in a structure in which it encloses all of an upper surface and side surfaces of the light emitting chip 150.

The light emitting diode 200 according to the second exemplary embodiment of the present invention may further include the heat sink 280.

The heat sink 280 may be positioned beneath the sub-mount substrate 121c and contact a lower surface of the sub-mount substrate 121c. The heat sink 280 may have excellent thermal conductivity to easily radiate heat from the sub-mount substrate 121c. Therefore, the heat sink 280 may further improve a heat radiation effect.

The insulating part 113 may be formed of a portion of the substrate. The insulating part 113 serves to insulate the heat sink 280 and the first and second lead frames 121 and 123 from each other. The heat sink 280 is made of a metal material having excellent thermal conductivity. Therefore, the heat sink 280 needs to be insulated from the first and second lead frames 121 and 123. Therefore, the insulating part 113 has a structure in which it encloses the heat sink 280.

As described above, the light emitting diode 200 according to the second exemplary embodiment of the present invention has the effects of the light emitting diode 100 (See FIG. 1) according to the first exemplary embodiment of the present invention. In addition, in the light emitting diode 200 according to the second exemplary embodiment of the present invention, reliability may be further improved in implementing light having a desired wavelength by the wavelength converting layer 151, formed on the light emitting chip 150 and a process of mixing the phosphors with the oil 270 is omitted, such that a manufacturing time may be decreased. Further, the light emitting diode 200 according to the second exemplary embodiment of the present invention includes the heat sink 280 disposed beneath the sub-mount substrate 121c, such that heat radiation is more excellent.

Figure 5:
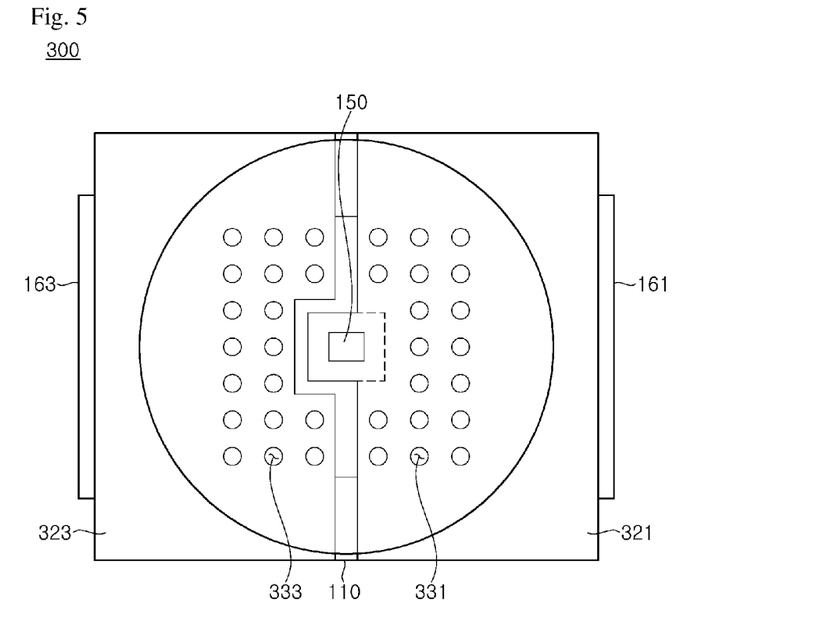
FIG. 5 is a plan view illustrating a light emitting diode according to a third exemplary embodiment of the present invention.

FIG. 5 is a plan view illustrating a light emitting diode according to a third exemplary embodiment of the present invention.

All components of the light emitting diode 300 according to the third exemplary embodiment of the present invention except for first and second lead frames 321 and 323 and a plurality of first and second accommodating holes 331 and 333 are the same as those of the light emitting diode 100 (See FIG. 1) according to the first exemplary embodiment of the present invention. Therefore, the same components will be denoted by the same reference numerals, and a detailed description therefor will be omitted.

The light emitting diode 300 according to the third exemplary embodiment of the present invention has a structure in which the first and second lead frames 321 and 323 are extended up to regions adjacent to the light emitting chip 150.

A contact area between the first and second lead frames 321 and 323 and the oil is wider than that between the first and second lead frames and the oil in the light emitting diode 100 (See FIG. 1) according to the first exemplary embodiment of the present invention, due to the structure in which the first and second lead frames 321 and 323 are extended up to the regions adjacent to the light emitting chip 150. Therefore, the light emitting diode 300 according to the third exemplary embodiment of the present invention has an advantage that a heat radiation feature is more excellent.

The plurality of first and second accommodating holes 331 and 333 may be formed on the first and second lead frames 321 and 322 extended up to the regions adjacent to the light emitting chip 150, and may be formed in a circular shape in order to widen a contact area between the first and second lead frames 321 and 323 and the oil. Although shapes of the plurality of first and second accommodating holes 331 and 333 are limited to the circular shapes in the light emitting diode 300 according to the third exemplary embodiment of the present invention, shapes of the plurality of first and second accommodating holes 331 and 333 may also be changed into another shape.

Figure 6:
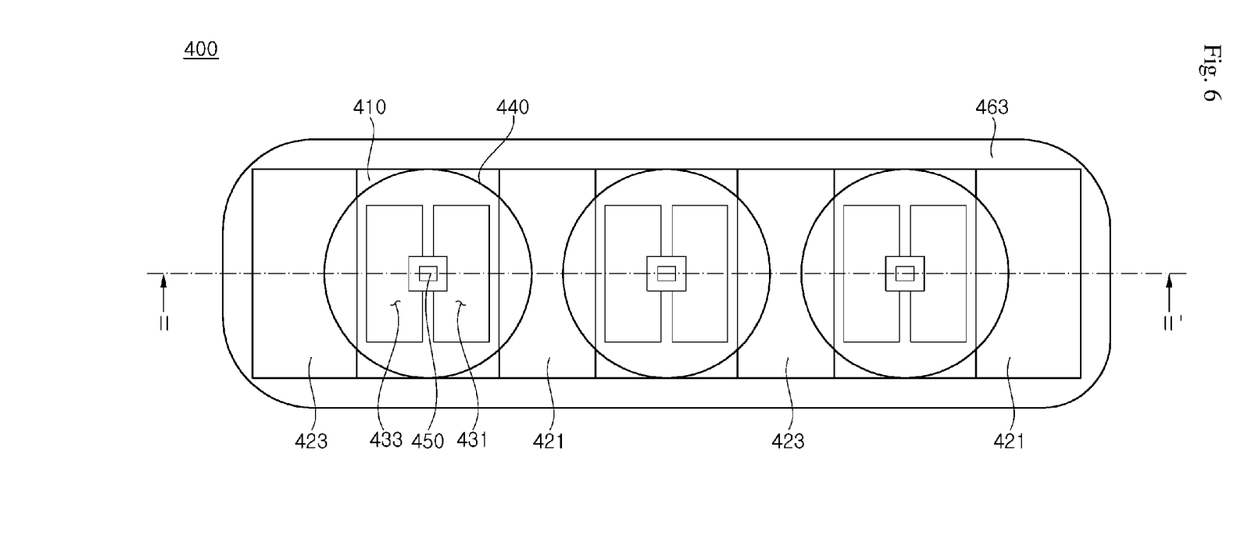
FIG. 6 is a plan view illustrating a light emitting diode according to a fourth exemplary embodiment of the present invention.
Figure 7:
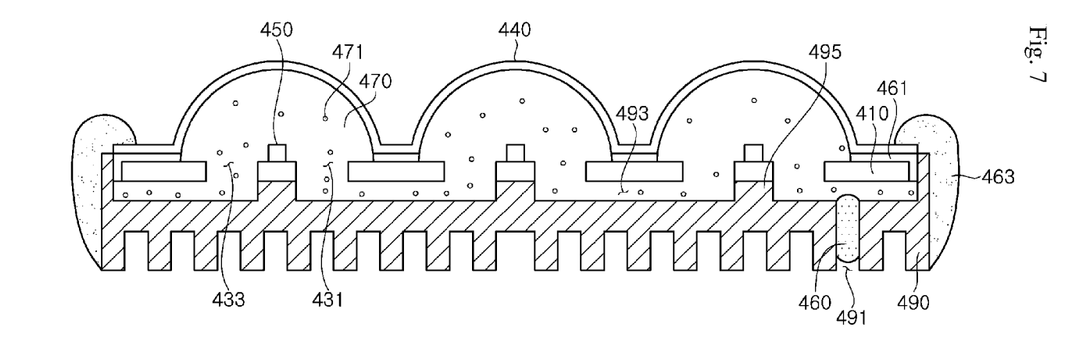
FIG. 7 is a cross-sectional view of the light emitting diode taken along line II-IF of FIG. 6.

FIG. 6 is a plan view illustrating a light emitting diode according to a fourth exemplary embodiment of the present invention, and FIG. 7 is a cross-sectional view of the light emitting diode taken along line II-II' of FIG. 6.

As illustrated in FIGS. 6 and 7, the light emitting diode 400 according to the fourth exemplary embodiment of the present invention is configured to include a substrate 410, a plurality of first lead frames 421, a plurality of second lead frames 423, a plurality of light emitting chips 450, a plurality of first accommodating holes 431, a plurality of second accommodating holes 433, lenses 440, and a heat radiation plate 490.

The substrate 410 includes the plurality of first and second lead frames 421 and 423 having different polarities. Although not illustrated in detail in FIGS. 6 and 7, the substrate 410 includes a plurality of sub-mount substrates on which the plurality of light emitting chips 450 are mounted. The sub-mount substrates are formed simultaneously with the first and second lead frames 421 and 423 at the time of forming the first and second lead frames 421 and 423.

The plurality of light emitting chips 450 may be electrically connected to the first and second lead frames 421 and 423 by wires (not illustrated). However, the present invention is not limited thereto. That is, electrodes of the light emitting chips 450 may also be directly connected to the first and second lead frames 421 and 423 depending on a kind of light emitting chips 450. In addition, one of the electrodes of the light emitting chips 450 may be connected to any one of the first and second lead frames 421 and 423 by the wire, and the other of the electrodes of the light emitting chips 450 may be directly connected to the other of the first and second lead frames 421 and 423 by the wire.

The heat radiation plate 490 further includes a plurality of support parts 495 formed by protruding regions corresponding to the light emitting chips 450. The support parts 495 protrude in an upward direction of the heat radiation plate 490, and support lower portions of the substrate 410 corresponding to positions of the light emitting chips 450.

The heat radiation plate 490 further includes side parts formed at an edge thereof, wherein the side parts protrude in an upward direction.

The heat radiation plate 490 includes accommodating grooves 493 formed in an intaglio shape by the plurality of support parts 495 and the side parts.

The heat radiation plate 490 further includes a plurality of rugged parts protruding in a downward direction. The rugged parts serve to widen a contact area between the heat radiation plate 490 and external air.

The heat radiation plate 490 further includes a through-hole 491 formed in order to adjust a pressure by an oil 470 accommodated in the substrate 410 and the heat radiation plate 490 at the time of assembling the substrate 410 and the heat radiation plate 490 to each other.

In the light emitting diode 400 according to the fourth exemplary embodiment of the present invention, an adhesive material 461 is used in order to assemble the substrate 410 and the lenses 440 to the heat radiation plate 490, and first encapsulation resins 463 covering boundary regions between the substrate 410 and the lenses 440 and the heat radiation plate 490 are formed in order to prevent leakage of the oil 470.

In addition, the light emitting diode 400 according to the fourth exemplary embodiment of the present invention may further include a second encapsulation resin 460 encapsulating the through-hole 491.

The second encapsulation resin 460 serves to prevent the leakage of the oil 170 accommodated in the substrate 410 and the heat radiation plate 490.

In addition, the second encapsulation resin 460 has predetermined elasticity. That is, the second encapsulation resin 460 is made of a resin having elasticity to serve to buffer repeated expansion and contraction of the oil 470 by heat.

The plurality of first and second accommodating holes 431 and 433 may be formed at the time of manufacturing the substrate 410. The first and second accommodating holes 431 and 433 may be formed to penetrate through the substrate 410. An inner portion of the heat radiation plate 490 may be exposed by the plurality of first and second accommodating holes 431 and 433.

The oil 470 is made of a light-transmitting material having high light transmissivity. In the present invention, the oil 470 may be one of mineral oil and Amoco oil, but is not limited thereto. That is, the oil 470 may be any oil that is transparent over the entire visible light region and has a refractive index of 1.4 to 1.5.

The oil 470 includes phosphors 471 converting light generated from the light emitting chip 450 into light having a specific wavelength band desired by a user.

The oil 470 may not only be accommodated on the light emitting chip 450, but also be accommodated in the heat radiation plate 490 through the first and second accommodating holes 431 and 433.

The oil 470 may contact the first and second lead frames 421 and 423 through the first and second accommodating holes 431 and 433, and may be accommodated in the accommodating grooves 493 of the heat radiation plate 490. Therefore, the oil 470 may contact an inner surface of the heat radiation plate 490.

The oil 470 contacts the light emitting chips 450, the first and second lead frames 421 and 423, and the heat radiation plate 490 by convection to cool heat. The light emitting diode 400 according to the fourth exemplary embodiment of the present invention has an optimized structure that may maximize cooling performance by convection by widening a contact area between the oil 470 and the heat radiation plate 490 and the first and second lead frames 421 and 423.

In a method of manufacturing the light emitting diode 400 according to the fourth exemplary embodiment of the present invention, assembly between the lenses 440, the substrate 410, and the heat radiation plate 490 is performed in a container in which the oil 470 is filled. Here, the assembly between the lens 440, the substrate 410, and the heat radiation plate 490 may be performed by the adhesive material 461.

Here, the substrate 410 and the support parts 495 of the heat radiation plate 490 may adhere to each other by a conductive tape, or the like, in order to improve a heat radiation function.

When the assembly between the lenses 440, the substrate 410, and the heat radiation plate 490 in the container in which the oil 470 is accommodated is completed, the boundary regions between the substrate 410 and the lenses 440 and the heat radiation plate 490 are covered using the first encapsulation resins 463 in order to prevent the leakage of the oil 470.

Here, in the light emitting diode 400 according to the fourth exemplary embodiment of the present invention, the through-hole 491 may be encapsulated using the second encapsulation resin 460 before the boundary regions are covered using the first encapsulation resins 463.

As described above, in the light emitting diode 400 according to the fourth exemplary embodiment of the present invention, the oil 470 is accommodated in the accommodating grooves 493 of the heat radiation plate 490 through the first and second accommodating holes 431 and 433 of the substrate 410, thereby making it possible to maximize cooling performance using convection.

In addition, the light emitting diode 400 according to the fourth exemplary embodiment of the present invention includes the second encapsulation resin 460 that may buffer the expansion and the contraction of the oil 470, thereby making it possible to improve reliability of a product.

Figure 8:
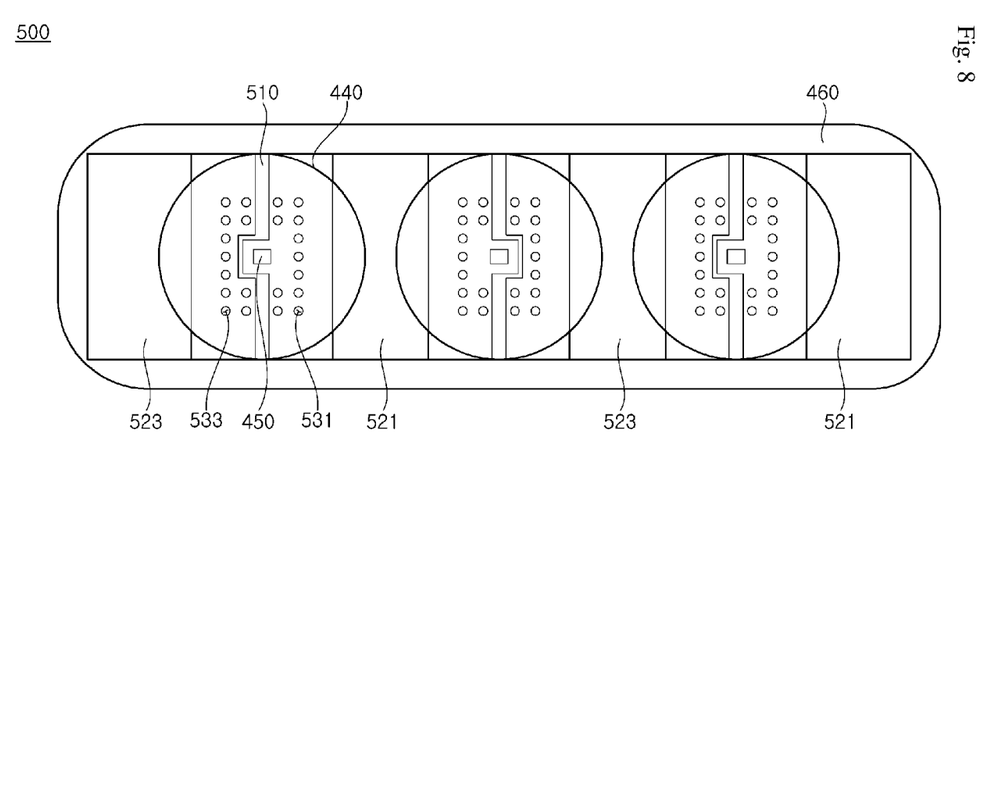
FIG. 8 is a plan view illustrating a light emitting diode according to a fifth exemplary embodiment of the present invention.
Figure 9:
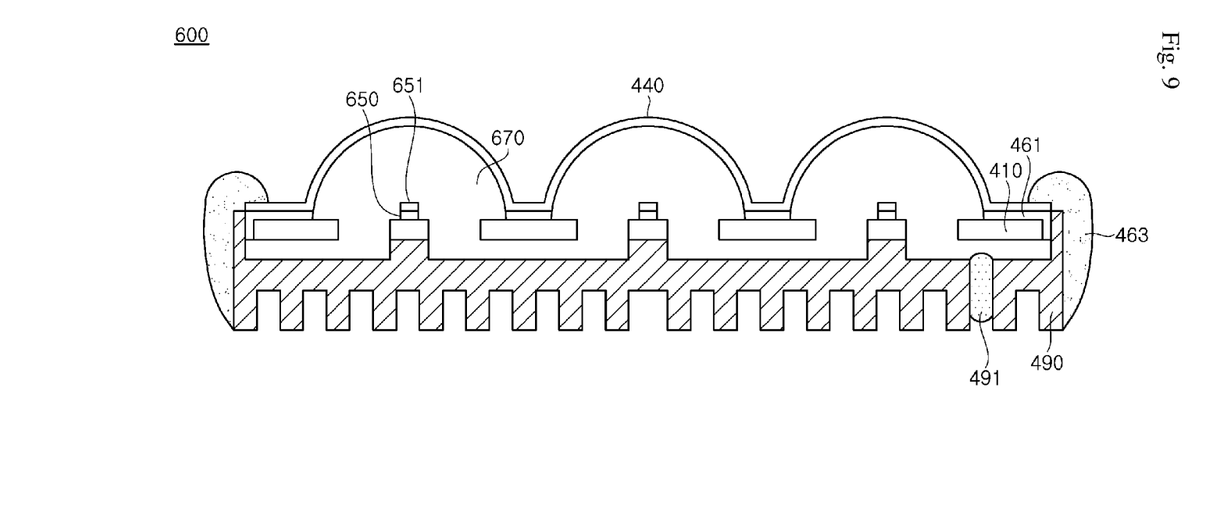
FIG. 9 is a cross-sectional view illustrating a light emitting diode according to a sixth exemplary embodiment of the present invention.

FIG. 8 is a plan view illustrating a light emitting diode according to a fifth exemplary embodiment of the present invention, and FIG. 9 is a cross-sectional view illustrating a light emitting diode according to a sixth exemplary embodiment of the present invention.

As illustrated in FIG. 8, all components of the light emitting diode 500 according to the fifth exemplary embodiment of the present invention except for a substrate 510, a plurality of first and second accommodating holes 531 and 533, first and second lead frames 521 and 523 are the same as those of the light emitting diode 400 (See FIG. 6) according to the fourth exemplary embodiment of the present invention. Therefore, the same components will be denoted by the same reference numerals, and a detailed description therefor will be omitted.

The first and second lead frames 521 and 523 have a structure in which they are extended up to regions adjacent to the light emitting chips 450. Therefore, a contact area with the oil is larger in the light emitting diode 500 according to the fifth exemplary embodiment of the present invention than in the light emitting diode 400 (See FIG. 6) according to the fourth exemplary embodiment of the present invention. The light emitting diode 500 according to the fifth exemplary embodiment of the present invention has an advantage that a heat radiation feature is more excellent.

The plurality of first and second accommodating holes 531 and 533 may be formed on the first and second lead frames 521 and 523 extended up to the regions adjacent to the light emitting chip 450, and may be formed in a circular shape in order to widen a contact area between the first and second lead frames 521 and 523 and the oil. Although shapes of the plurality of first and second accommodating holes 531 and 533 are limited to the circular shapes in the light emitting diode 500 according to the fifth exemplary embodiment of the present invention, shapes of the plurality of first and second accommodating holes 531 and 533 may be changed into another shape.

As illustrated in FIG. 9, all components of the light emitting diode 600 according to the sixth exemplary embodiment of the present invention except for a wavelength converting layer 651 and an oil 670 are the same as those of the light emitting diode 400 (See FIG. 6) according to the fourth exemplary embodiment of the present invention. Therefore, the same components will be denoted by the same reference numerals, and a detailed description therefor will be omitted.

In the light emitting diode 600 according to the sixth exemplary embodiment of the present invention, the wavelength converting layers 651 are formed on the light emitting chips 650.

The wavelength converting layer 651 serves to convert light from the light emitting chip 650 into light having a specific wavelength band. Therefore, in the light emitting diode 600 according to the sixth exemplary embodiment of the present invention, the wavelength converting layers 651 are directly formed on the light emitting chips 650, such that the oil 670 does not include phosphors.

Although only a structure in which the wavelength converting layers 651 are formed on the light emitting chips 650 in the light emitting diode 600 according to the sixth exemplary embodiment of the present invention has been described, the present invention is not limited thereto. That is, the wavelength converting layers 651 may also be formed in a structure in which they enclose all of upper surfaces and side surfaces of the light emitting chips 650.

As described above, the light emitting diode 600 according to the sixth exemplary embodiment of the present invention has the effects of the light emitting diode 400 (See FIG. 4) according to the fourth exemplary embodiment of the present invention. In addition, in the light emitting diode 600 according to the sixth exemplary embodiment of the present invention, reliability may be further improved by implementing light having a desired wavelength by the wavelength converting layers 651 formed on the light emitting chips 650, and a process of mixing the phosphors with the oil 670 is omitted, such that a manufacturing time may be decreased.

Although only a one-row structure in which a plurality of light emitting chips 650 are provided in one direction has been described hereinabove, the present invention is not limited thereto. That is, the plurality of light emitting chips 650 may be arranged in a plurality of columns. That is, the light emitting diode according to the present invention may include all of various arrangement structures in which the light emitting chips are arranged in a plurality of columns and a plurality of rows in an arrangement structure of the light emitting chips.

In addition, in the light emitting chip according to the present invention, a sapphire substrate, a spinel substrate, a gallium nitride substrate, a silicon carbide substrate, or a silicon substrate may be used as a base substrate. In the present invention, the gallium nitride substrate may be used as the base substrate so as to implement a high efficiency light emitting diode by decreasing a crystal defect between the base substrate and a semiconductor layer grown on the base substrate.

In addition, although only exemplary embodiments in which the phosphors are included in the oil or the wavelength converting layer is directly formed on the light emitting chip in the light emitting diode according to the present invention have been described, the present invention is not limited thereto, but may include both of a light emitting diode in which the phosphors are applied onto an inner surface or an outer surface of the lens and a light emitting diode in which the phosphors are included in the lens.

Although various exemplary embodiments and features of the present invention have been described hereinabove, the present invention is not limited to the exemplary embodiments and the features described above, but may be variously modified without departing from the spirit of the present invention.

The invention claimed is:

1. A light emitting diode, comprising:
at least one light emitting chip;
a substrate comprising lead frames electrically connected to electrodes of the at least one light emitting chip, the lead frames comprising a first lead frame enclosing a first side of the substrate and a second lead frame enclosing a second side of the substrate, the first and second lead frames each comprising upper and lower leads, respectively;
a lens disposed on the substrate and enclosing the at least one light emitting chip;
an oil disposed in the lens and the substrate; and
a heat radiation plate disposed below the substrate,
wherein:
the heat radiation plate comprises an accommodating groove in which the oil is disposed;
the heat radiation plate is coupled to the substrate and the lens in a first region, and comprises a first encapsulation resin disposed in the first region;
the substrate comprises accommodating holes disposed in the upper leads and in which the oil is disposed; and
the oil contacts outer surfaces and inner surfaces of the upper leads and contacts inner surfaces of the lower leads.

2. The light emitting diode of claim 1, further comprising shielding members interposed between the upper leads and the lower leads along an outer side of the lead frames and shielding the oil,
wherein the shielding members comprise a non-light-transmitting resin and have elasticity.

3. The light emitting diode of claim 1, further comprising shielding members interposed between the upper leads and the lower leads along an outer side of the lead frames and shielding the oil,
wherein the shielding members comprise a light-transmitting resin and have elasticity.

4. The light emitting diode of claim 1, further comprising a sub-mount substrate on which the at least one light emitting chip is disposed,
wherein the substrate comprises a support part on which the sub-mount substrate is disposed.

5. The light emitting diode of claim 4, wherein the support part comprises an insulating material.

6. The light emitting diode of claim 4, wherein:
the support part comprises a heat conductive metal material; and
the substrate further comprises an insulating part bonded to the support part.

7. The light emitting diode of claim 1, further comprising a sub-mount substrate on which the at least one light emitting chip is disposed,
   wherein the heat radiation plate comprises a support part protruding on an upper surface thereof and on which the sub-mount substrate is disposed.

8. The light emitting diode of claim 1, wherein the heat radiation plate further comprises a separate through-hole for adjusting a pressure at the time of accommodating the oil therein.

9. The light emitting diode of claim 1, wherein the oil comprises mineral oil.

10. The light emitting diode of claim 1, further comprising a wavelength converting layer disposed on the at least one light emitting chip.

11. The light emitting diode of claim 1, wherein the lead frames extend up to the surroundings of the at least one light emitting chip, and
   accommodating holes are disposed in the lead frames adjacent to the at least one light emitting chip.

12. The light emitting diode of claim 1, further comprising phosphors disposed on an inner surface or an outer surface of the lens, or disposed in the lens.

* * * * *